United States Patent
Wang

(10) Patent No.: US 7,180,125 B2
(45) Date of Patent: Feb. 20, 2007

(54) P-CHANNEL ELECTRICALLY ALTERABLE NON-VOLATILE MEMORY CELL

(76) Inventor: Chih-Hsin Wang, 6585 Gillis Dr., San Jose, CA (US) 95120

( * ) Notice: Subject to any disclaimer, the term of this patent is extended or adjusted under 35 U.S.C. 154(b) by 0 days.

(21) Appl. No.: 10/962,288

(22) Filed: Oct. 8, 2004

(65) Prior Publication Data

US 2006/0033146 A1    Feb. 16, 2006

Related U.S. Application Data

(63) Continuation-in-part of application No. 10/919,555, filed on Aug. 16, 2004.

(51) Int. Cl.
  *H01L 29/788* (2006.01)
(52) U.S. Cl. .................................... 257/315; 257/302
(58) Field of Classification Search ............... 257/302, 257/315, 321, 322
See application file for complete search history.

(56) References Cited

U.S. PATENT DOCUMENTS

| | | | |
|---|---|---|---|
| 4,816,883 A | 3/1989 | Baldi | |
| 4,957,877 A | 9/1990 | Tam et al. | |
| 5,106,772 A | 4/1992 | Lai | |
| 5,822,242 A | 10/1998 | Chen | |
| 5,877,524 A | 3/1999 | Oonakado et al. | |
| 5,966,329 A | 10/1999 | Hsu et al. | |
| 6,140,676 A * | 10/2000 | Lancaster | 257/315 |
| 6,172,397 B1 | 1/2001 | Oonakado et al. | |
| 6,631,087 B2 * | 10/2003 | Di Pede et al. | 365/185.18 |
| 6,791,883 B2 | 9/2004 | Swift et al. | |

OTHER PUBLICATIONS

U.S. Appl. No. 10/107,440, filed Oct. 3, 2002, Ohba et al.
U.S. Appl. No. 10/606,164, filed Apr. 1, 2004, Cappelletti et al.
K. Naruke et al., "Stress Induced Leakage Current Limiting to Scal Down EEPROM Tunnel Oxide Thickness", IEDM Technical Digest, p. 424-427, 1988.
C. Diorio, "A p-Channel MOS Synapse Transistor with Self-Convergent memory Writes", IEEE Trans. on Electron Devices, vol. 47, pp. 464-472, 2000.
T. Ohnakado et al., "Novel Electron Injection Method Using Band-to-Band Tunneling Induced Hot Electron (BBHE) for Flash Memory with a p-channel . . . ", IEDM Tech. Dig.,p. 279, 1995.

(Continued)

*Primary Examiner*—Phuc T. Dang

(57) ABSTRACT

A nonvolatile memory cell is provided. The memory cell comprises a storage transistor and an injector in a semiconductor substrate of a p-type conductivity. The injector comprises a first region of the p-type conductivity and a second region of an n-type conductivity. The storage transistor comprises a source, a drain, a channel, a charge storage region, and a control gate. The source and the drain have the p-type conductivity and are formed in a well of the n-type conductivity in the substrate with the channel of the well defined therebetween. The charge storage region is disposed over and insulated from the channel by a first insulator. The control gate is disposed over and insulated from the charge storage region by a second insulator. Further provided are methods operating the memory cell, including means for injecting electrons from the channel through the first insulator onto the charge storage region and means for injecting holes from the injector through the well through the channel through the first insulator onto the charge storage region.

17 Claims, 14 Drawing Sheets

OTHER PUBLICATIONS

Nishida et al, "Oxide field and thickness dependence of trap generation in 9-30 nm dry and dry/wet/dry oxides", J. Appl. Phys., vol. 69, pp. 3986-3994, 1991.

U.S. Appl. No. 09/945,398, filed Feb. 21, 2002, Leonard Forbes.
U.S. Appl. No. 09/515,630, filed Jan. 31, 2002, Leonard Forbes.
U.S. Appl. No. 09/818,296, filed Oct. 11, 2001, Lin et al.

* cited by examiner

P-CHANNEL ELECTRICALLY ALTERABLE NON-VOLATILE MEMORY CELL

RELATED APPLICATION

This application is a Continuation-In-Part of U.S. patent application Ser. No. 10/919,555 filed on Aug. 16, 2004, entitled "ELECTRICALLY ALTERABLE NON-VOLATILE MEMORY CELL".

TECHNICAL FIELD

The present invention deals with nonvolatile memory, and relates more specifically to Electrically Programmable Read Only Memories (EPROM) and Electrically Erasable and Programmable Read Only Memories (EEPROM). More particularly, the present invention relates to memory cell structure and method altering charge state of memory cells by employing mechanism injecting holes onto floating gate or charge storage sites of non-volatile memory cells for erase operation.

BACKGROUND OF THE INVENTION

Non-volatile semiconductor memory cells permitting charge storage capability are well known in the art. The charges stored thereon define the states of a memory cell. Typically, the states can be either two levels or more than two levels (for multi-level states storage). In terms of charge storage scheme, in general, the memory cells can be divided into two main categories. The first type of memory uses a conductive or semiconductor region for charge storage. The charge storage region is electrically insulated from but capacitively coupled to surrounding electrodes through surrounding insulators. Charges stored in such memory are evenly distributed through out the storage region. Memory cells with such type of charge storage scheme are commonly referred as "floating-gate" type of cells. Typically, such floating gate memory cells have been of the single-gate type, split-gate type, or stack-gate type, or a combination thereof.

The second type of memory stores charges in a plurality of discrete storage sites, such as trapping centers of an appropriate dielectric material ("trapping dielectric"). The storage sites in the trapping dielectric is electrically insulated from but capacitively coupled to surrounding electrodes through a storage insulator. The Memory cells employing such type of storage scheme are commonly referred as "charge-trapping" memory cells. The storage sites can be also in nano-crystal form, which is typically a semiconductor in nanometer scale (nano-crystals). The memory cells employing such type of storage scheme are commonly referred as "nano-crystal" memory cells. These memory cells do not require a floating-gate. Therefore, it provides advantages over the floating-gate memory cells in area such as negligible interference between adjacent cells, and reduced process complexity. Furthermore, the charges in such memory cell can be stored at localized sites (traps or nano-crystals). Therefore it also has the advantage that in the event there is a local breakdown in region of the storage dielectric or in surrounding dielectrics next to one of the storage sites, charges stored at other sites can still be retained.

Stack-gate memory has the advantages over other types of memory cells on a simpler process in manufacturing such type of memory cell. One of such non-volatile memory cells has been proposed in U.S. Pat. No. 5,877,524, and in U.S. Pat. No. 6,172,397 B1, which are hereby incorporated by reference. As will be described hereinafter, there are several disadvantages in the disclosures of prior art. The present invention provides cell structures and operation method with advantages over the prior art.

The present invention can best be understood with an understanding of how the memory cells in prior art are constructed and how they are operated for program and erase operations. Thus a short introduction is presented to describe the prior art cell structure, and the cell operations.

U.S. Pat. Nos. 5,877,524, and 6,172,397 B1 taught memory cell structure and operation method (e.g. program and erase). A relevant technical article "Novel Electron Injection Method Using Band-to-Band Tunneling Induced Hot Electron (BBHE) for Flash Memory with a p-channel Cell", by T. Ohnakado et al., IEDM Technical Digest, pp. 279–282, 1995, described in detail the operation and the performance of memory cell taught in U.S. Pat. Nos. 5,877,524, and 6,172,397 B1. The memory cell is a p-channel based cell having advantage on higher injection efficiency (about 10 to 100 times higher) than an n-channel based cell (e.g. cell in U.S. Pat. No. 5,106,772). Here, the term "injection efficiency" is defined as the ratio of the number of carriers entering into FG to the number of charges supplied.

Illustrated in FIG. 1A is the bias condition for program operation along with a cross sectional view for a cell structure 100 of the prior art. The cell 100 comprises a storage transistor having a control gate (CG) 12, a floating gate (FG) 14, a body 16, a source 18, and a drain 20 with a channel 22 of the body 16 defined therebetween. Both the source 18 and the drain 20 are of p-type conductivity. The body 16 is of n-type conductivity and is in a well 24 of same conductivity ("n-Well"). The FG 14 is disposed over and insulated from the channel 22 by a layer of storage insulator 26. Likewise, the CG 12 is disposed over and insulated from the FG 14 by a coupling insulator 28. The prior art cell 100 can be electrically programmed by using BBHE injection mechanism. Referring to FIG. 1A, there are shown electrons 30 generated in the drain 20 under drain-to-FG overlapping region 31 through Band-to-Band Tunneling ("BTBT"). The generated electrons 30 are accelerated in an adjacent lateral field to get heated up. The transport direction of a portion of those electrons can be redirect to the FG after experiencing scattering event and portion of them can climb over barrier height between the n-Well 24 and the storage insulator 26 to enter into FG 14, as illustrated in the dotted-line arrow 32 in FIG. 1A. Also illustrated are hole carriers (holes) 34 generated through BTBT in the drain 20 under the overlapping region 31. Due to the bias polarity, the holes 34 are swept away by electric field in that region along the path shown in dash-line arrow 36 and subsequently move out of the drain 20. The holes 34 thus have no effect on the charges stored on FG 14. The source 18, drain 20, CG, 12, and n-Well 24 are attached to their respective electrodes, through which biases are applied thereto. Typical voltages for programming the memory cell are: +10V (applied to CG 12), −6V (applied to drain 20), and 0V (applied to the n-Well 24). The source 18 is left open during the program operation.

FIG. 1B illustrates the bias condition for an erase operation of the prior art cell 100. The erase operation in prior art is done by utilizing Fowler-Nordheim tunneling to remove electrons 37 stored in FG 14 along the trajectory shown in dotted-lines 38a and 38b. Typical voltages for erasing the memory cell are: −10V (applied to CG 12), +10V (applied to source 18), and +10V (applied to the n-Well 24). The drain 20 is left open during the erase operation.

As described hereinbefore, the memory cells in U.S. Pat. No. 5,877,524, and in U.S. Pat. No. 6,172,397 B1 are erased by Fowler-Nordheim tunneling mechanism. Same mechanism has been widely employed in other types of memory cells (for example, U.S. application Ser. No. 10/178,658, and U.S. Pat. Nos. 4,957,877, 5,106,772, 5,146,426, and 5,432,739). In erasing these types of nonvolatile memories with such mechanism, a large voltage drop (typically ranging from 10 to 20V) across the storage insulator is required to perform the operation in order to set a desired logic states (e.g. a "0" state) to the memory. Employing Fowler-Nordheim tunneling mechanism to erase these types of memory cells unavoidably introduces stress field in the range of about 10 MV/cm to the storage insulator, which isolates the floating gate or the storage sites from surrounding conductive regions. This high field stress effect on the storage insulator results in charge leakage and retention failure even when memory cells are under a low field condition. This effect is known as the Stress Induced Leakage Current (SILC), and has been shown being the dominant leakage mechanism causing retention failure in non-volatile memory industry (see K. Naruke et al, "Stress Induced Leakage Current Limiting to Scale Down EEPROM Tunnel Oxide Thickness", IEDM Technical Digest, pp. 424–427, 1988.). Therefore, the memory cell disclosed in prior art is believed suffered from high field induced SILC issue.

Like other types of stack-gate memory cell, the cell of prior art is compact in size as it contains only a storage transistor. However, an additional disadvantage associated with this type of memory cell is that the BBHE program scheme can often introduce cell disturb problem in memory cells sharing a same drain junction. Therefore, this restricts the drain junction of each memory cell from being shared with neighboring memory cells when cell is arranged in a memory array. The viable array architecture taught therein requires a metal contact to be formed in a pair of cells. Further, for disturb prevention, a select transistor is often required to be disposed in between and connected in series with the storage transistor and the contact. The cell size thus can be undesirably enlarged. Therefore, such cell thus is believed to have the disadvantage on larger cell size.

The present invention provides cell structure and operation method of a p-channel based electrical erasable programmable memory cell that can avoid the high field stress effect and the cell disturb problem. The erase operation of the present cell permits the voltage drop across the storage insulator be confined in range less than about 3 MV/cm. Therefore, it avoids the high field stress on the insulator and hence the SILC issue. Other advantages, objects and features of the present invention will become apparent by a review of the specification, claims and appended figures.

DISCLOSURE OF THE INVENTION

It is the object of the invention to provide an improved electrically alterable memory cell and operation methods.

Briefly, a preferred embodiment of the present invention is a nonvolatile memory device. A substrate of a semiconductor material is provided having a p-type conductivity. A well in the substrate is provided having an n-type conductivity. A source and a drain of p-type conductivity are formed in the well. A channel in the well is created in between the source and the drain. A charge storage region is disposed over and insulated from the channel by a storage insulator. A control gate is formed over and insulated from the charge storage region by a coupling insulator. An injector having a p-type region and an n-type region is formed next to the channel. The injector permits hole carriers be injected into the well, transporting through the channel through the storage insulator onto the charge storage region.

Briefly, another preferred embodiment of the present invention is a method operating the nonvolatile memory device. The method comprises the steps of applying a first voltage to the p-type region of the injector, applying a second voltage to the n-type region of the injector, applying a third voltage to at least one of the source and the drain to form an inversion layer in the channel, and applying a fourth voltage to the control gate. The second voltage is sufficiently more negative with respect to the first voltage. The third voltage is sufficiently more negative with respect to the second voltage, and the fourth voltage is sufficiently more negative with respect to the third voltage to permit holes from the injector transporting through the well through the channel through the storage insulator onto the charge storage region.

Briefly, another preferred embodiment of the present invention is methods programming and erasing the nonvolatile memory device. The method of programming the memory cell comprises the steps of applying a first voltage to the well, applying a second voltage to the source, applying a third voltage to the drain, and applying a fourth voltage to the control gate. The fourth voltage is sufficiently more positive with respect to the third voltage and sufficient more negative with respect to the first and the second voltages. The third voltage is sufficiently more negative with respect to the first voltage to inject electrons from the channel through the storage insulator onto the charge storage region. The method of erasing the memory cell comprises the steps of applying a fifth voltage to the p-type region of the injector, applying a sixth voltage to the n-type region of the injector, applying a seventh voltage to at least one of the source and the drain to form an inversion layer in the channel, and applying a eighth voltage to the control gate. The sixth voltage is sufficiently more negative with respect to the fifth voltage. The seventh voltage is sufficiently more negative with respect to the sixth voltage, and the eighth voltage is sufficiently more negative with respect to the seventh voltage to permit holes from the injector transporting through the well through the channel through the storage insulator onto the charge storage region.

Briefly, another preferred embodiment of the present invention is an electrically erasable and programmable nonvolatile memory array. The array comprises a substrate of semiconductor material of a p-type conductivity, a well of an n-type conductivity in the substrate, and a plurality of nonvolatile memory cells arranged in a rectangular array of rows and columns. Each of the plurality of nonvolatile memory cells comprises a source and a drain of the p-type conductivity formed in the well with a channel of the well defined therebetween, a charge storage region disposed over and insulated from the channel by a storage insulator, and a control gate formed over and insulated from the charge storage region by a coupling insulator. Each of the memory cells further comprises an injector having a p-type region and an n-type region formed next to the channel.

These and other objects and advantages of the present invention will become clear to those skilled in the art in view of the description of the preferred embodiment as described herein and as illustrated in the figures of the drawings.

BRIEF DESCRIPTION OF THE DRAWINGS

The invention is herein described, by ways of example only, with reference to accompanying drawings, wherein FIG. 1A (prior art) is a cross sectional view illustrating the memory cell architecture of the prior art, and further illustrating the trajectory of the hot electrons, holes and bias conditions for the program operation.

DETAILED DESCRIPTION OF THE INVENTION

Figure 1A:
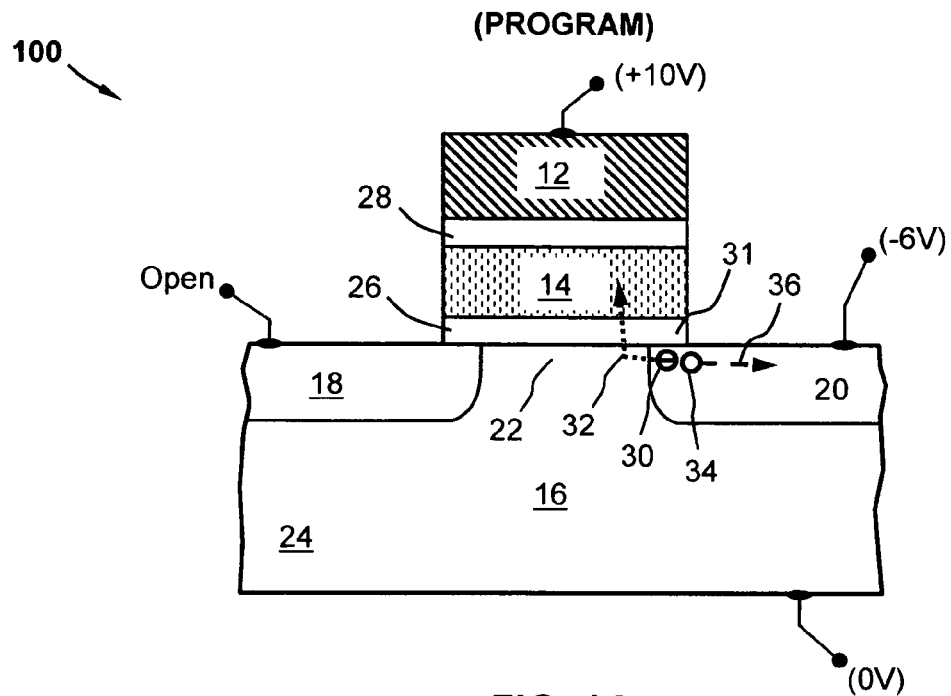
FIG. 1B (prior art) is a cross sectional view illustrating the memory cell architecture of the prior art, and further illustrating the trajectory of the tunneling electrons and bias conditions for the erase operation.
Figure 1B:
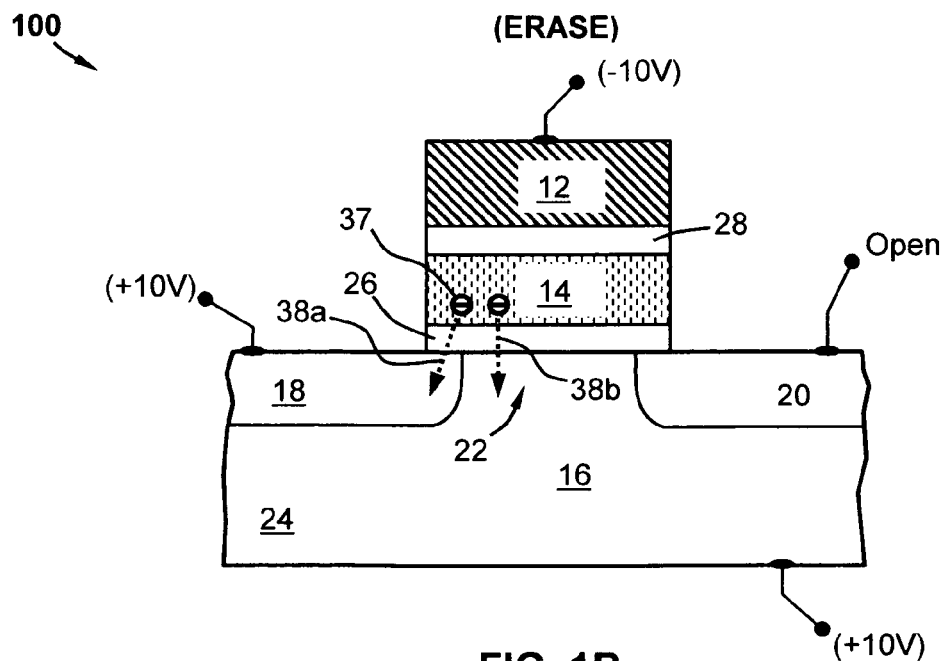

Embodiments of the present invention described in the following detailed description are directed at memory cell structures and operation methods. Those of ordinary skill in the art will realize that the detailed description is illustrative only and is not intended to restrict the scope of the claimed inventions in any way. Other embodiments of the present invention, beyond those embodiments described in the detailed descriptions, will readily suggest themselves to those of ordinary skill in the art having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with fabrication- and business-related constraints, and that these specific goals will vary from one implementation to another and from one manufacturer to another. Moreover, it will be appreciated that such a development effort might be complex and time-consuming, but would nevertheless be a routine undertaking of engineering for those of ordinary skill in the art having the benefit of this disclosure.

As used herein, the symbol p– indicates a heavily doped semiconductor material of p-type conductivity typically having a doping level of p-type impurities (e.g. Boron) on the order of $10^{20}$ atoms/cm$^3$. The symbol p+ indicates a lightly doped semiconductor material of p-type conductivity typically having a doping level on the order of $10^{16}$ to $10^{18}$ atoms/cm$^3$ for p-doped wells and on the order of $10^{15}$ atoms/cm$^3$ for p-substrate material (p-sub). The symbol n– indicates a heavily doped semiconductor material of n-type conductivity typically having a doping level of n-type impurities (e.g. Arsenic) on the order of $10^{20}$ atoms/cm$^3$. The symbol n– indicates a lightly doped semiconductor material of n-type conductivity typically having a doping level on the order of $10^{16}$ to $10^{18}$ atoms/cm$^3$ for n-doped wells (n-Wells) and on the order of $10^{15}$ atoms/cm$^3$ for n-substrate material. Those of ordinary skill in the art will now also realize that a range of doping concentrations around those described is suitable for the present purposes. Essentially, any process capable of forming memory cells is suitable for the present purposes. Doped regions may be formed by thermal diffusion or by ion implantation. When it is written that something is doped at approximately the same level as something else, the doping levels are within approximately a factor of ten of each other.

The Memory Cell of the Present Invention

Figure 2:
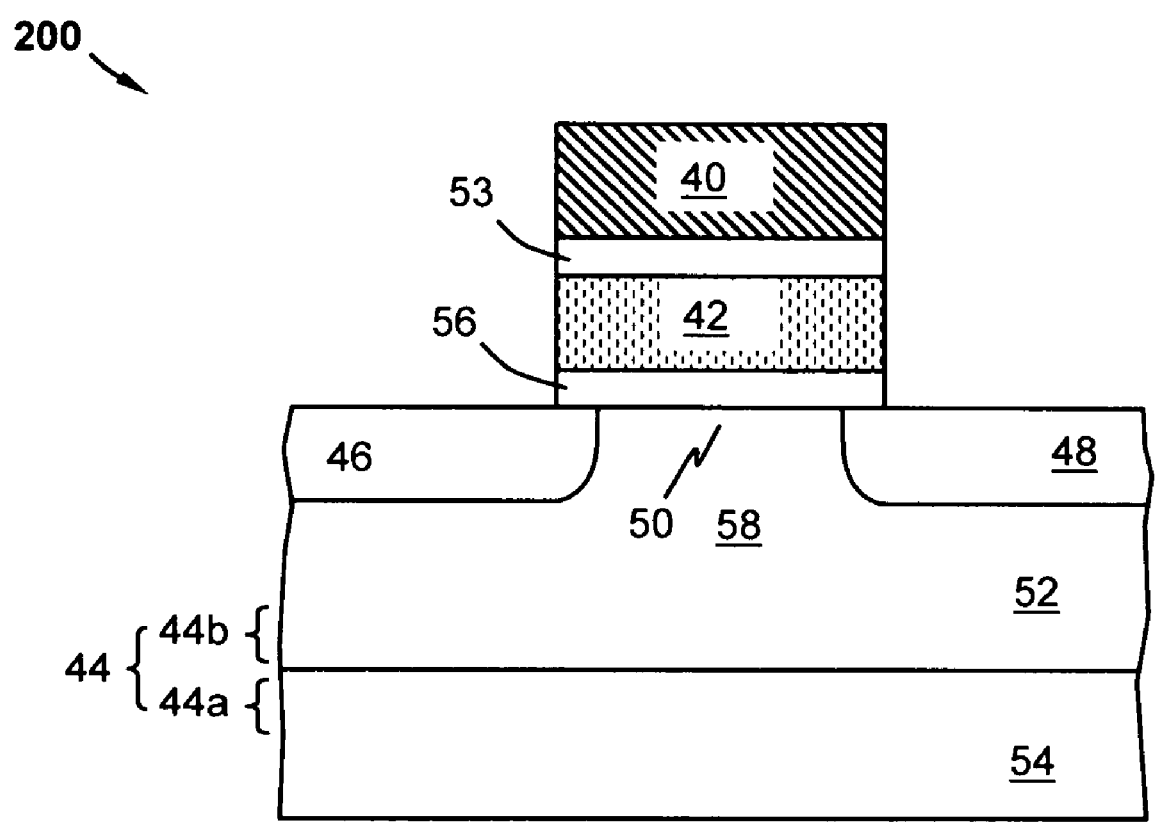
FIG. 2 is a cross-sectional view of a memory cell in accordance with one embodiment of the present invention.

FIG. 2 illustrates a memory cell 200 in accordance with one embodiment of the present invention. The cell 200 is a p-channel based memory cell, and comprises a control gate (CG) 40, a floating gate (FG) 42, an injector 44, a source 46 and a drain 48 of the p-type conductivity with a channel 50 of a well of an n-type conductivity (n-Well 52) defined therebetween. The source 46 and the drain 48 are formed in the n-Well 52 and have a doping level in the range of about $5 \times 10^{18}$ atoms/cm$^3$ to about $5 \times 10^{21}$ atoms/cm$^3$. CG and FG regions 40 and 42 may comprise n+ doped polysilicon material, p+ doped polysilicon material, metal, or any other suitable material used for forming a conductive gate. The FG 42 is disposed over and insulated from the channel 50 by a storage insulator 56 of a thickness in the range of about 50 Å to 200 Å. The CG 40 is disposed over and insulated from the FG 42 by a coupling insulator 53. The coupling insulator 53 can comprise a single layer (e.g. an oxide layer) or can comprise a stack of dielectrics (e.g. an oxide/nitride/oxide tri-layer). The n-Well 52 is formed in a p-type silicon substrate 54 (hereinafter "p-sub") having a doping level at about $1\times10^{15}$ atoms/cm$^3$. The n-Well 52 also functions as a body 58 region of the memory cell 200 and can have a doping level in the range between about $1\times10^{16}$ atoms/cm$^3$ to about $1\times10^{18}$ atoms/cm$^3$. The injector 44 in the cell structure 200 comprises a first region 44a of the p-type conductivity in a portion of the p-sub 54 and a second region 44b of the n-type conductivity in a portion of the n-Well 52, and is disposed adjacent to the channel 50. The CG 40, FG 42, source 46, drain 48, channel 50, body 58, and dielectrics 53 and 56 construct a storage transistor providing capability storing and sensing electric charges on FG 42.

Figure 3:
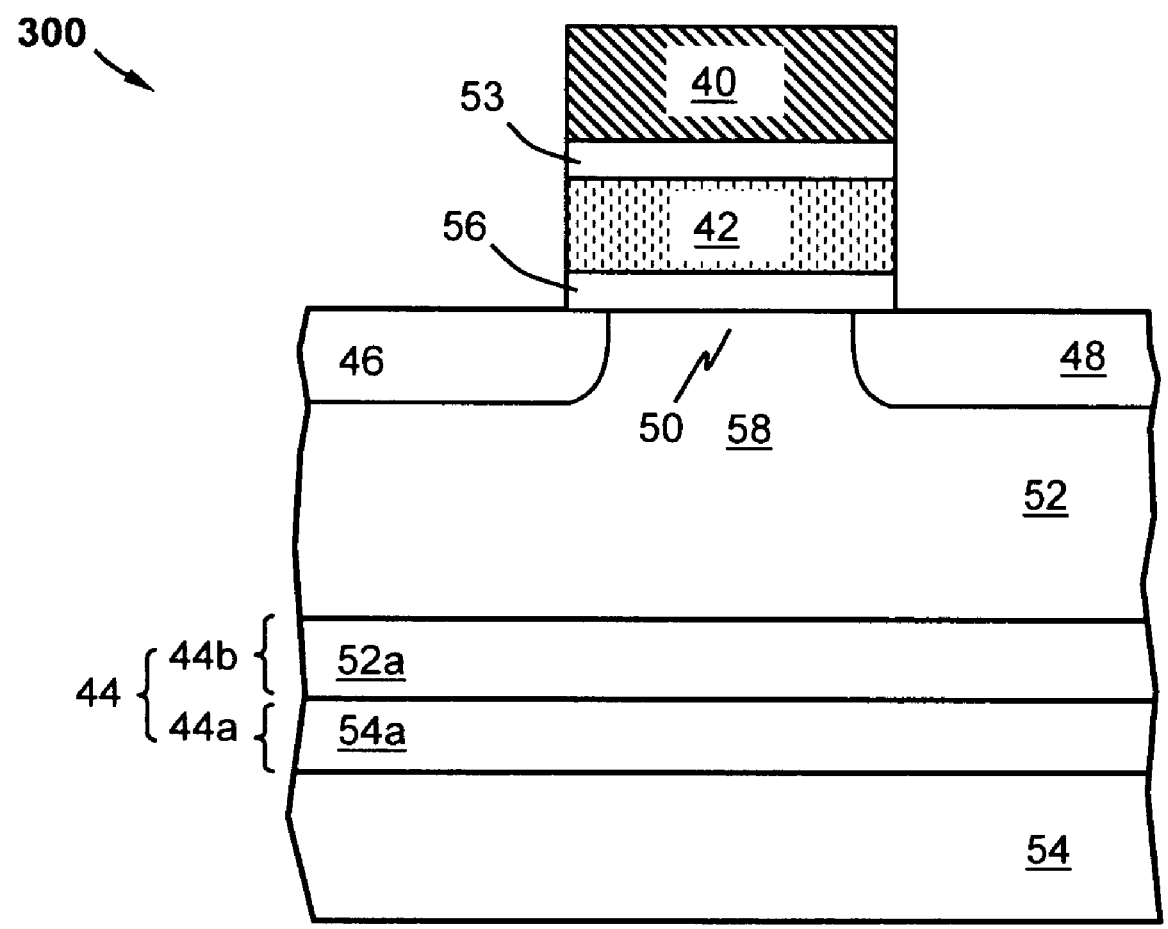
FIG. 3 is a cross-sectional view of a memory cell in accordance with another embodiment of the present invention.

FIG. 3 illustrates a memory cell 300 in accordance with another embodiment of the present invention. The cell structure 300 is similar to that of cell 200 except with a difference on the first and the second regions 44a and 44b of the injector 44. In the cell 300, the first region 44a of the injector comprises a p-type buried well 54a (p+BW) having a doping level in the range between about $1\times10^{16}$ atoms/cm$^3$ to about $1\times10^{20}$ atoms/cm$^3$. One consideration in selecting the doping level for the p+BW 54a is to suppress the de-biasing effect on the injector 44 during an erase operation. The de-biasing effect can be greatly reduced by selecting p+BW 54a having a doping level in the higher side (e.g. on the order of about $10^{19}$ to $10^{20}$ atoms/cm$^3$). The cell 300 further provides an n-type buried well 52a (n-BW) as the second region 44b of the injector 44. Similar consideration in selecting the doping level for the p+BW 54a can be applied to the n-BW 52a to suppress the de-biasing effect. The doping level of the n-BW 52a can be in the range between about $1\times10^{16}$ atoms/cm$^3$ to about $5\times10^{19}$ atoms/cm$^3$.

Program Operation

Figure 4A:
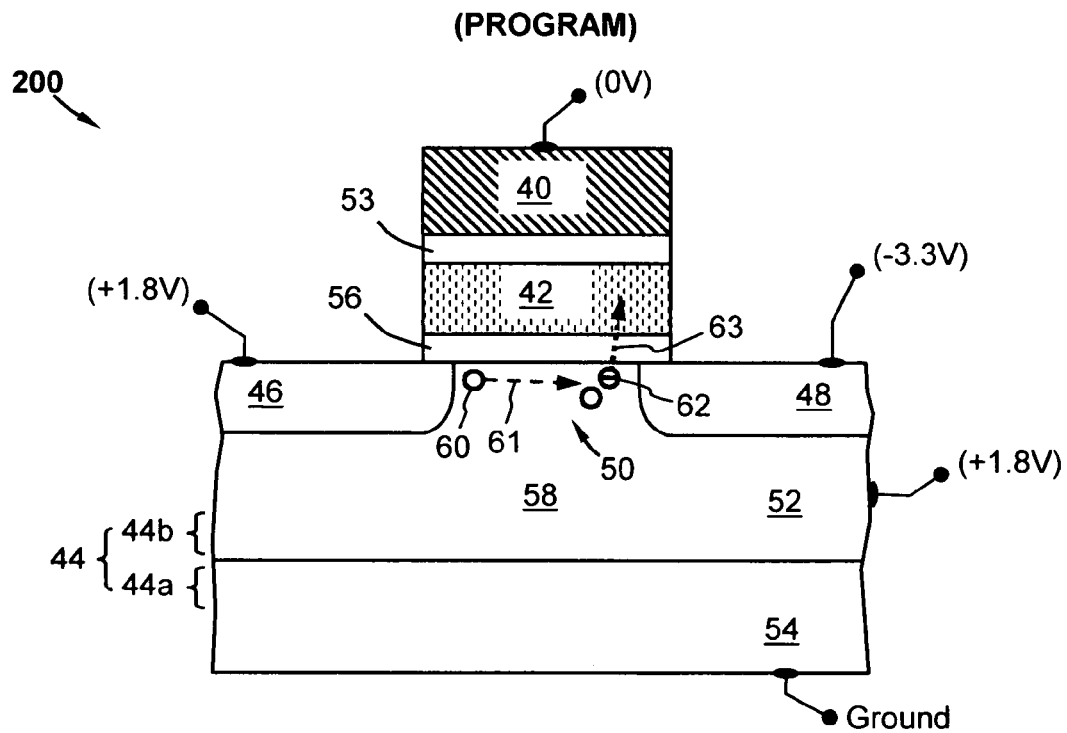
FIG. 4A is a cross sectional view illustrating the memory cell in FIG. 2, and further illustrating the trajectory of the hot electrons, holes and bias conditions for the program operation of the memory cell.

The program operation of memory cells in accordance with the present invention can be done by employing the ICHE well-known in the art (see Chris Diorio, "A p-Channel MOS Synapse Transistor with Self-Convergent Memory Writes," IEEE Trans. Electron Devices, vol. 47, pp. 464–472, 2000). An example is now given using cell 200 of the present invention as an illustration. Referring to FIG. 4A, there is shown cell 200 with the source 46, drain 48, p-sub 54, n-Well 52, and CG 40 attached to their respective electrodes. Also shown are bias conditions of the program operation and the trajectory of carriers transport for ICHE mechanism. The cell is programmed by first forming an inversion layer of hole carriers 60 in the channel 50. Typically, this is done by applying a voltage to the CG 40 through which a voltage is steered to FG 42 via capacitive-coupling. The voltage of FG ($V_{FG}$) is maintained at a level that is lower than the source voltage by at least a threshold voltage ($V_T$) of the cell 200. The source 46 and drain 48 of the memory cell 200 is biased in such a way that the channel hole carriers 60 can transport along a direction shown in a dash line 61 and be accelerated by an electric field nearby the drain side of the channel 50 with a portion of the holes heated up to generate secondary electrons 62 through impact ionization. A portion of the secondary electrons 62 can transport along trajectory shown in the dotted-line 63. These electrons 62 can have energy higher than the barrier height of the storage insulator 56 and hence can make their way entering FG 42 and stored thereon. An example on biases for programming the cell is: −3.3 V (applied to drain 48), 0 V (applied to CG 40), +1.8 V (applied to source 46), and +1.8 V (applied to n-Well 52). The p-sub 54 is ground during the operation. The injector 44 is turned off and has no effect in this operation.

Erase Operation

The key aspect of the present invention lies in the manner in which the memory cell is erased. Rather than erasing memory cell with techniques in the prior art (e.g. Fowler-Nordheim mechanism), the cell of present invention is erased by employing the Substrate Hot Hole Injection (SHHI) mechanism.

Figure 4B:
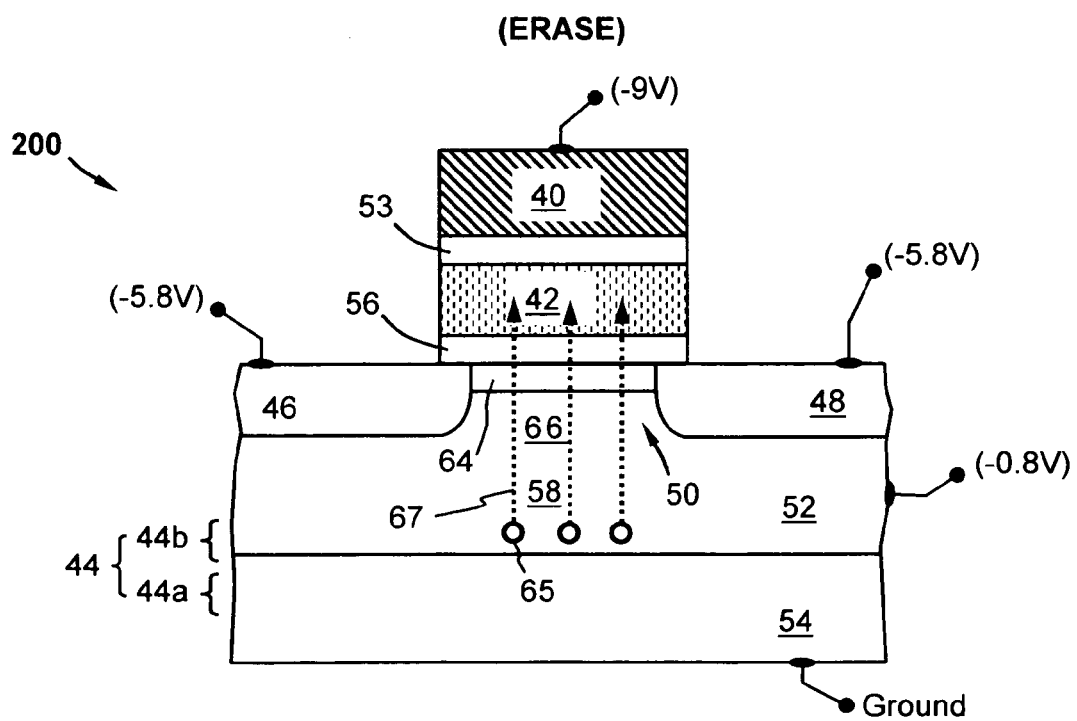
FIG. 4B is a cross sectional view illustrating the memory cell in FIG. 2, and further illustrating the trajectory of the holes and bias conditions for the erase operation of the memory cell.

FIG. 4B illustrate the bias condition for the erase operation of the present invention with illustration made on the memory cell 200. Referring to FIG. 4B, there is shown an inversion layer 64 formed in the channel 50. The inversion layer 64 is formed by applying a control gate voltage ($V_{CG}$) to CG 40 for steering the floating gate voltage ($V_{FG}$) through capacitive coupling. With $V_{CG}$ at a level sufficiently low, the inversion layer 64 is formed while FG 42 is negatively charged with electron carriers. Usually, FG 42 is negatively charged with electron carriers after the cell 200 is programmed to a program state. The presence of the inversion layer 64 can be maintained as long as the floating gate voltage ($V_{FG}$) is lower than the voltage of source 46 and drain 48 by about a $V_T$ of the memory cell 200. The inversion layer 64 is electrically connected to the source and the drain regions 46 and 48, and therefore it also serves as an electrical extension of these regions. The potential at the silicon surface (hereinafter "surface potential") in the inversion layer 64 thus can be set by these regions. Also shown in FIG. 4B is the injector 44 disposed adjacent to the channel 50. The injector 44 is forward biased to supply hole carriers 65 for SHHI. After hole carriers 65 being injected into the n-Well 52 by the injector 44, they transport through diffusion process due to their concentration gradient in the n-Well 52. A portion of them make their way reaching a space charge region (SCR) 66 formed under the inversion layer 64 and are accelerated by an electrical field in that region to transport along a direction substantially vertical to the silicon surface toward the inversion layer 64 in the channel 50. Some of them can transverse the SCR 66 and the inversion layer 64 without scattering at all (i.e. in a "ballistic" way). Under these conditions, the transport of hole carriers 65 resembles that in vacuum, but with the effective mass and group velocity of the hole carriers in the semiconductor. These hole carriers can gain enough energy in SCR 66 to surmount the hole barrier height $\Phi_{VB}$ (also termed "valence band offset") between the storage insulator 56 and the n-Well silicon 52, making their way entering into FG region 42 and stored thereon. A trajectory on the hole movement is shown in dotted-line arrow 67 in FIG. 4B to illustrate this effect. An example on biases for programming the cell is: −5.8 V (applied to drain 48), −9 V (applied to CG 40), −5.8 V (applied to source 46), and −0.8 V (applied to n-Well 52). The p-sub 54 is ground during the operation. The injector 44 thus is in a forward bias condition and is turned on in this operation.

Figure 5:
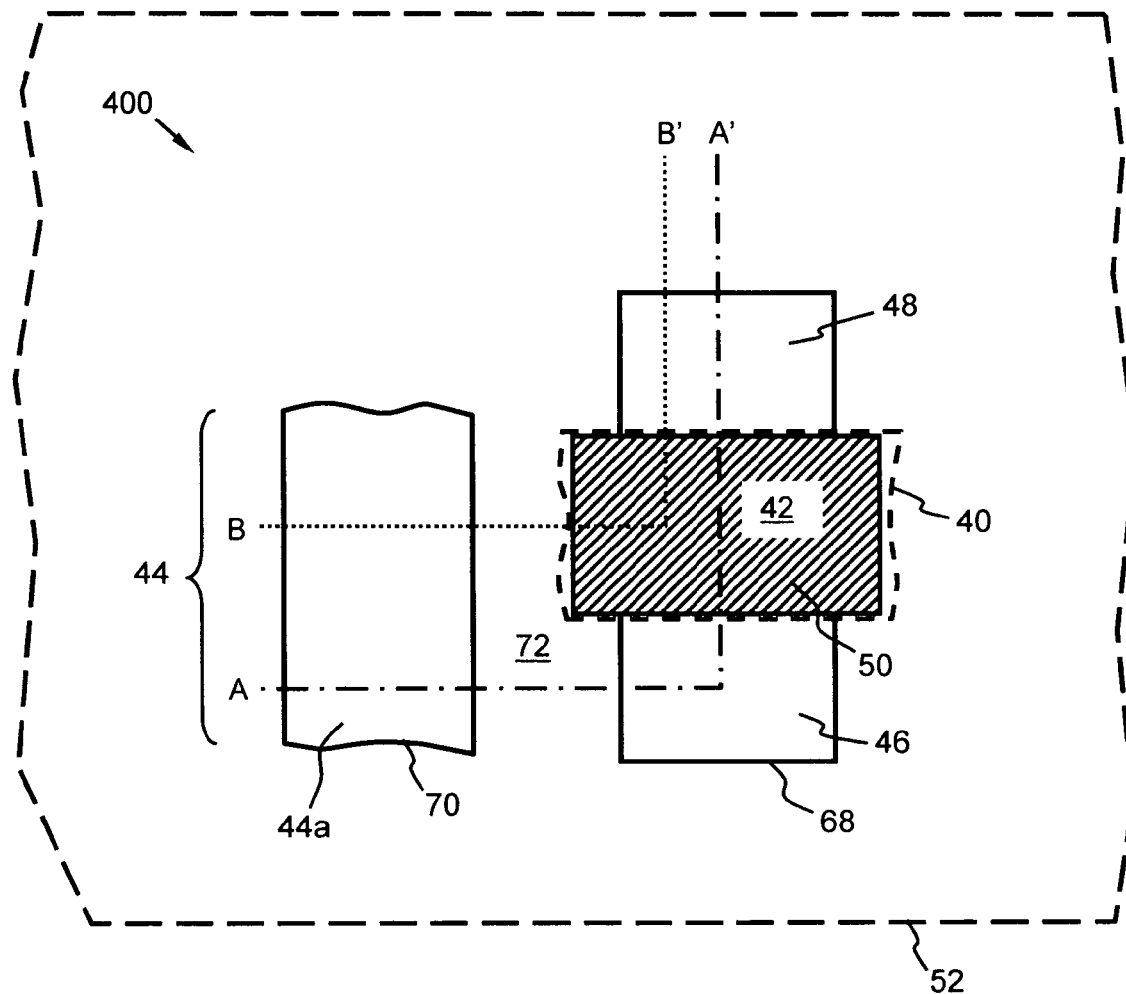
FIG. 5 is a top view illustrating the layout of a memory cell in accordance with another embodiment of the present invention.

The SHHI mechanism can be implemented in another embodiment of cell structure in accordance with the present invention. FIG. 5 is a top view illustrating the layout of a memory cell 400 of this embodiment. The layout of cell 400 comprises a control gate 40, a floating gate 42, a p+ source 46 and a p+ drain 48 in a first diffusion 68, and an injector 44 in a second diffusion 70. The overlapping region between the floating gate 42 and the first diffusion 68 defines a channel 50 of cell 400. The channel 50 divides the source 46 from the drain 48, and has a channel width along the horizontal direction and a channel length along the vertical direction of the layout in FIG. 5. The injector 44 comprises a p+ first region 44a defined by the second diffusion 70 in an n-Well 52, and is disposed adjacent to and isolated from the channel 50 of cell 400 by an isolation region 72. The isolation region 72 can be formed of a portion of n-Well using junction-isolation scheme well-known in the art. Alternatively, the isolation can be an insulator formed by using, for example, LOCOS or Shallow Trench Isolation (STI) techniques well-known in the art. Other suitable schemes and techniques may be used for forming the isolation region.

Although the first region 44a in FIG. 5 is illustrated as a dedicated region for injector 44, it should be apparent to those having ordinary skill in the art that the first region 44a can be a source or a drain region of an adjacently disposed memory cell when cell 400 is in an array having a plurality of cells that are formed in a rectangular array of rows and columns.

Figure 6:
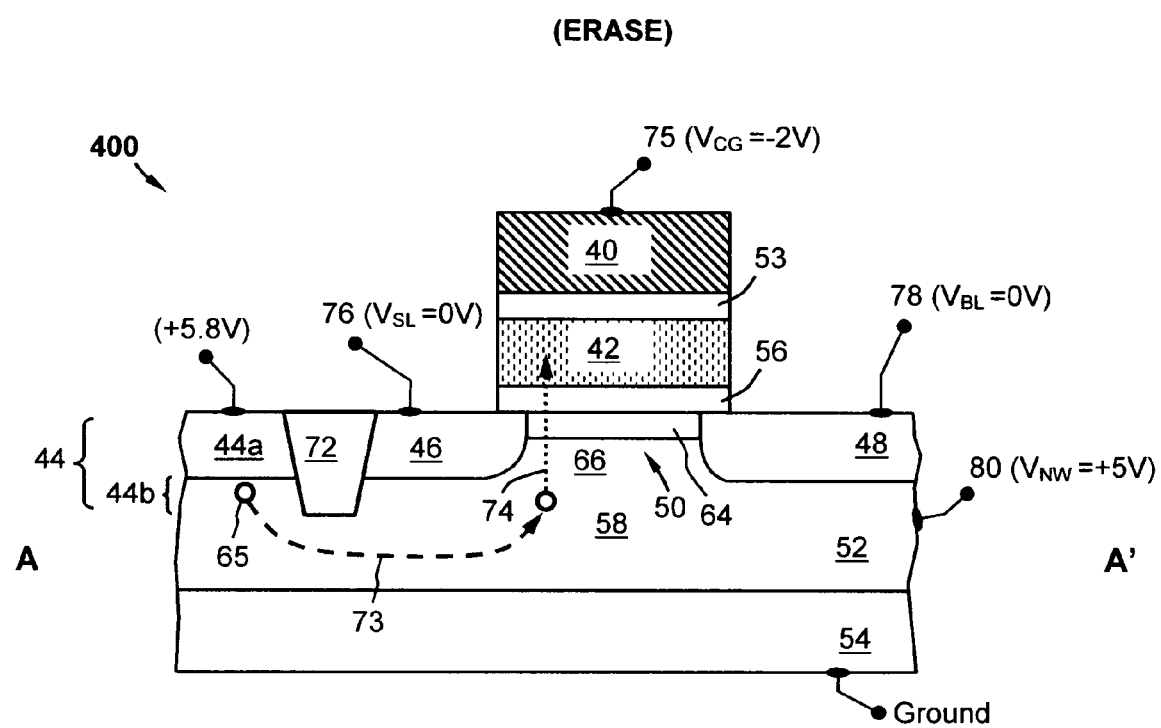
FIG. 6 is a cross sectional view along line AA' in FIG. 5 to illustrate the memory cell architecture, and further to illustrate the trajectory of the holes movement and the bias conditions for the erase operation of the memory cell.
Figure 7:
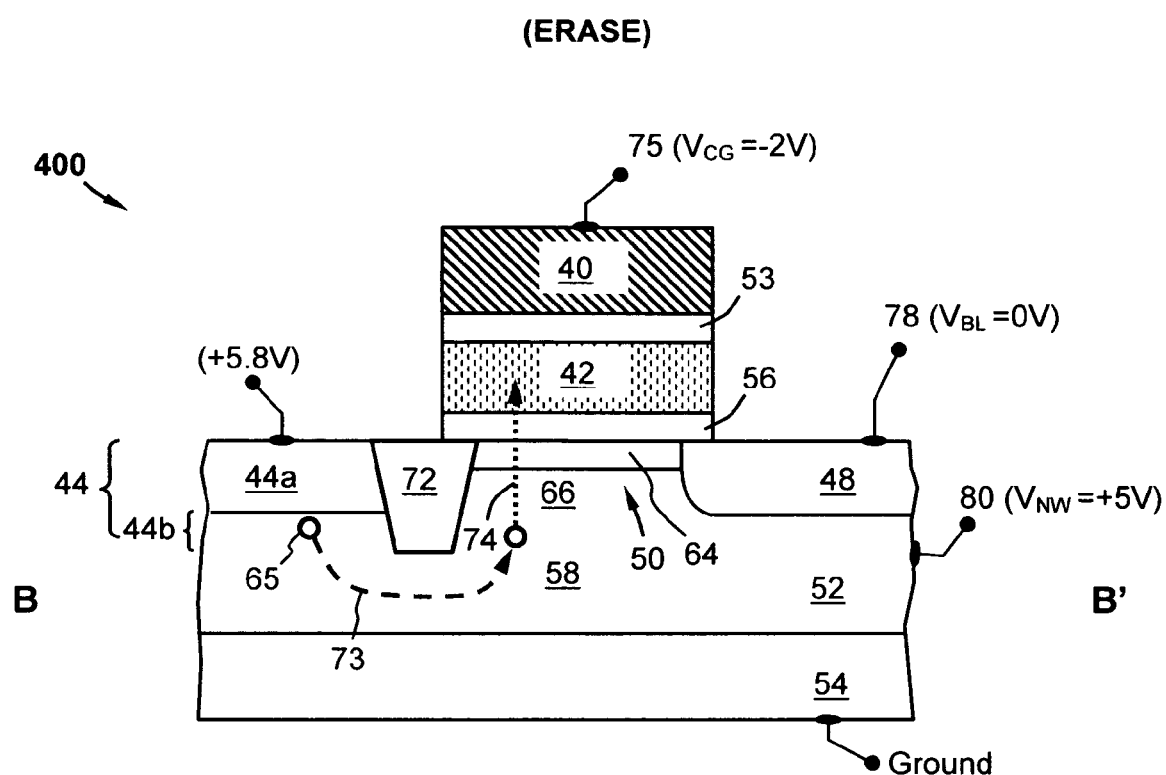
FIG. 7 is a cross sectional view along line BB' in FIG. 5 to illustrate the memory cell architecture, and further to illustrate the trajectory of the holes movement and the bias conditions for the erase operation of the memory cell.

FIGS. 6 and 7 illustrate the cross sectional view on cut-planes along line AA' and line BB' in FIG. 5, respectively. Also illustrated is an example on the bias conditions of the erase operation in accordance with the present invention. Referring to FIG. 6, the memory cell 400 is similar to the cell 200 in FIG. 4B except with a differences on the injector 44. The injector 44 in memory cell 400 is constructed with the first region 44a comprising a p-diffusion disposed from the top of the substrate surface. Further, the injector is disposed adjacent to and isolated from the channel 50 by the isolation region 72. The isolation region 72 is illustrated in Shallow Trench Isolation (STI) as an example.

FIG. 6 further shows that after hole carriers 65 being injected into the n-Well by the injector 44, they first transport through diffusing laterally along a trajectory shown in a dash-line arrow 73 due to their concentration gradient in the n-Well 52. A portion of them make their way reaching a space charge region (SCR) 66 formed under the inversion layer 64 and be accelerated by an electrical field in that region to transport along a direction substantially vertical to the silicon surface toward FG 42. The trajectory of holes transporting along this direction is shown along the dotted-line arrow 74. In the erase operation of the cells in accordance with the present invention, a control gate voltage ($V_{CG}$) can be supplied to CG 40 through a word line (WL) 75. A source line voltage ($V_{SL}$) can be supplied to the source 46 through a source line (SL) 76, and a bit line voltage ($V_{BL}$) can be supplied to the drain 48 through a bit line (BL) 78. $V_{SL}$ is typically set at a voltage level identical to $V_{BL}$ in this operation. An n-Well voltage ($V_{NW}$) supplied to the n-Well 52 through an n-Well electrode 80. An example on biases for erasing the cell is: 0 V (applied to drain 48), −2 V (applied to CG 40), 0 V (applied to source 46), +5 V (applied to n-Well 52), and +5.8V (applied to the first region 44a of the injector 44). Another example on biases for erasing the cell is: −2.5 V (applied to drain 48), −5 V (applied to CG 40), −2.5 V (applied to source 46), +2.5 V (applied to n-Well 52), and +3.3V (applied to the first region 44a of the injector 44). The p-sub 54 is ground during the operation. The injector 44 thus is in the forward bias condition and is turned on to emit holes 65 for the erase operation. The memory cell 400 in FIG. 6 can be programmed in similar way as cell 200 illustrated in FIG. 4A.

FIG. 7 shows the cross sectional view along cut-plane BB' of cell 400. The cross section differs from that shown in FIG. 6 in that the injector 44 is shown next to and separated from the channel 50 by the isolation region 72. The hole carriers 65 emitted from the injector 44 start their transport by diffusing laterally along a dash line 73 to transport across region under the isolation. The dash line 73 also depicts the traveling distance before these hole carriers 65 reaching the SCR 66. This distance is shorter in FIG. 7 than in FIG. 6, thus emitted hole carriers 65 are more likely to contribute to SHHI when transporting along BB' cut-plane. Upon reaching the SCR 66, likewise, a portion of the hole carriers 65 can be injected onto FG 42 along a trajectory (in dotted line 74) substantially vertical to the substrate surface.

The memory cells of the present invention provide cell structure and an erase method that can align the direction of the acceleration field to the injection direction. For example, referring to the memory cell 200 in FIG. 4B, hole carriers 65 are "aimed" directly at FG 42 while being accelerated by the electric field in SCR 66. Therefore, the injection efficiency for erase can be very high (estimated to be in the range of about 10 per millions to about 1000 per millions). Here, the term "injection efficiency for erase" is defined as the ratio of the number of hole carriers entering into FG 42 to the number of hole carriers arriving the inversion layer 64. In some embodiments, the injector is disposed under the channel, and hence does not occupied additional cell area. In some embodiments, the injector is disposed from the top of the substrate and can be the source or drain of an adjacent cell. Therefore, the injector does not occupy additional cell area either.

Other memory cells in accordance with the present invention, for example, cell 400, can have similar advantage on the high injection efficiency as that of the memory cell 200. An additional advantage of the cell 400 is on the lower absolute value on a maximum voltage required for cell operation (e.g. −5 V) than that required for operating the cell 200 (e.g. −10 V).

Figure 8A:
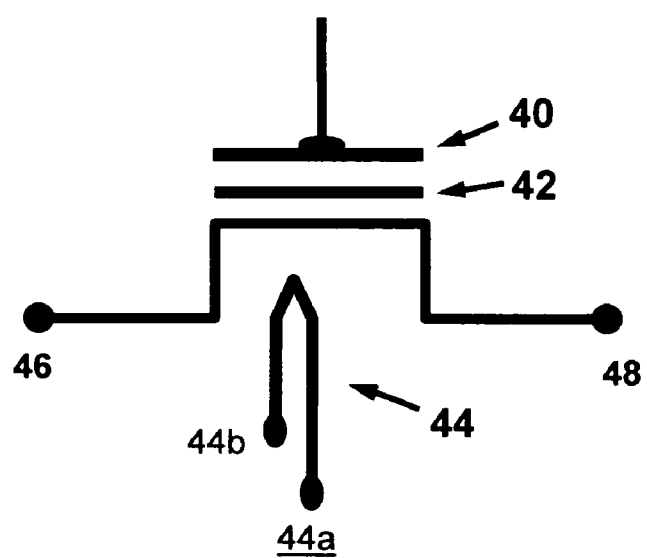
FIG. 8A is a schematic symbol for the memory cell in accordance with the present invention.
Figure 8B:
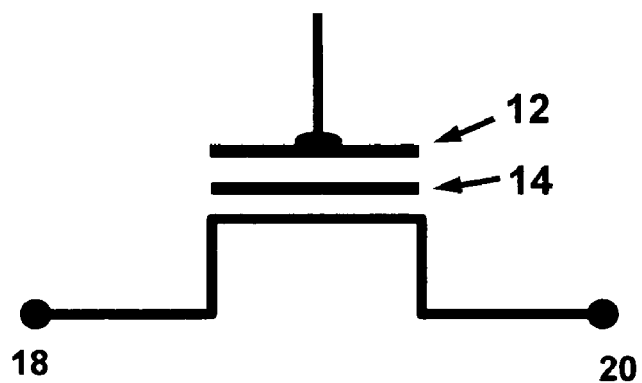
FIG. 8B is a schematic symbol for the memory cell of the prior art.

FIG. 8A shows the electrical circuit symbol for cells of the present invention, wherein the injector 44, according to the present invention, suitable for delivering holes to the floating gate of the nonvolatile memory cell is illustrated. FIG. 8A further shows the symbol of the storage transistor comprising source 46, drain 48, FG 42, and CG 40. In a contrast, the electrical circuit symbol for the prior art cells, and nodes of source 18, drain 20, FG 14, and CG 12 are illustrated in FIG. 8B.

Criteria on SHHI and its implications to the control gate voltage ($V_{CG}$) and to the memory operation of the present invention are provided herein by referring back to FIG. 6. With the inversion layer 64 formed in the channel 50, the source and the drain voltages are electrically connected together. Thus, with the bias condition shown in FIG. 6, the n-Well voltage ($V_{NW}$) and the source line voltage ($V_{SL}$) determine the strength of the electric field in SCR 66. The maximum energy $E_h$ that hole carriers 65 can acquire in the electric field equals the surface band bending potential $\phi_S$ in the SCR 66 multiplied by the electron unit charge q. Here, the surface band bending potential $\phi_S$ is defined as the difference between potential at substrate surface and at region away from the substrate surface where there is negligible band bending. The maximum energy $E_h$ can be expressed to first order in following expression:

$$E_h = q\phi_S = q^*(|V_{NW\text{-}SL}| + 2|\phi_F|),$$

where $V_{NW\text{-}SL} = V_{NW} - V_{SL}$, and $\phi_F$ is expressed as $$\phi_F = kT/q^* \ln(N_{DD}/n_i);$$

k is plank constant;
T is absolute temperature;
$N_{DD}$ is the concentration of donor impurities in n-Well; and
$n_i$ is the intrinsic carrier concentration of the semiconductor.

Therefore, to permit holes 65 to transport into the FG region 42, a proper voltage on $V_{NW}$ and $V_{SL}$ need be applied such that a first criterion of $E_h > \Phi_{VB}$ is met. Assuming the storage insulator 56 is an oxide, the barrier height between oxide and Si is about 4.7 eV for hole. Therefore, a voltage drop between n-Well 52 and source 46 in the range of about 4 V to 5 V can provide adequate energy supporting SHHI for the erase operation, assuming $N_{DD}$ is at a level of about $1\times10^{17}$ cm$^{-3}$.

Figure 9A:
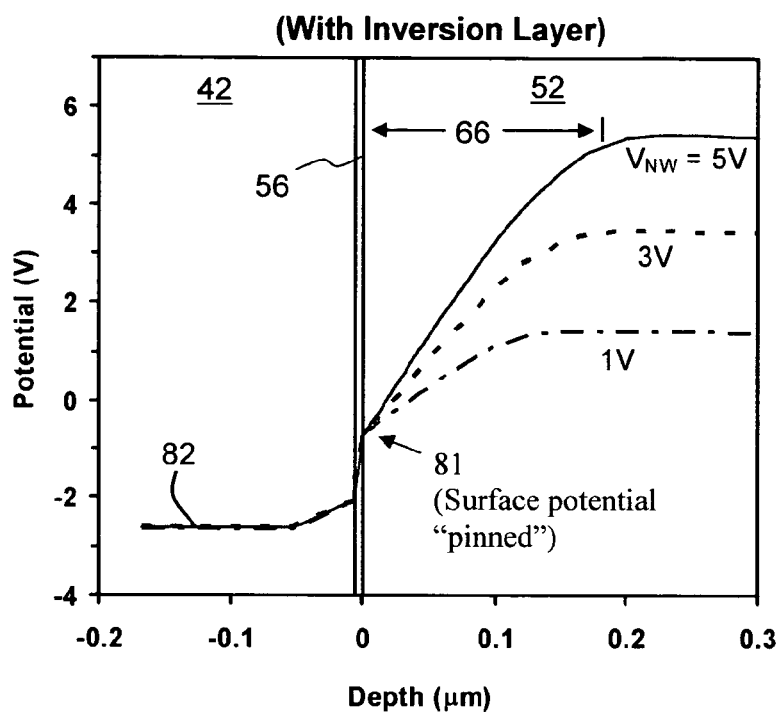
FIGS. 9A and 9B illustrate the potential along the dotted-line trajectory of hole movement in FIG. 6 for cell with and without the inversion layer in the channel, respectively.
Figure 9B:
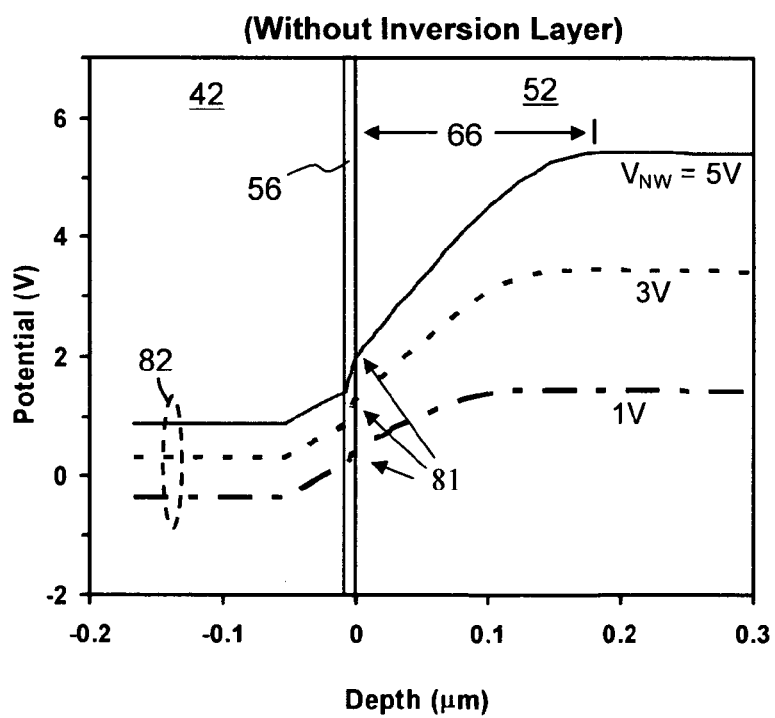

The above condition is valid only if the inversion layer 64 can be maintained in presence to effectively "pin" the surface potential at a level set by $V_{SL}$. This effect can be better described by referring to FIGS. 9A and 9B for situations with and without the inversion layer, respectively, in the channel 50. Illustrated in FIG. 9A is a simulation result on potentials along the dotted-line trajectory 74 in FIG. 6 for n-Well biased at three different voltages of $V_{NW}$. Referring to FIG. 9A, the depth at 0 μm corresponds to the surface of the n-Well in the silicon substrate, where a surface potential 81 is defined thereat. It is shown that the surface potentials 81 are effectively "pinned" by the inversion layer at a same level (at about −0.8 V) regardless of the levels on $V_{NW}$. Furthermore, the inversion layer completely shields the n-Well potential from penetrating into the FG region 42. This result in the floating gate potential $V_{FG}$ 82 being independent of the potential levels of $V_{NW}$ (as shown in FIG. 9A). Thus any increment on $V_{NW}$ is reflected in the increment on band bending of the potential in SCR 66, and hence on the acceleration field for SHHI. Similar results for the situation without the inversion layer in the channel is illustrated in FIG. 9B. Referring to FIG. 9B, there is shown the surface potentials 81 increases from about 0.4 V to about 2 V as increasing $V_{NW}$ from 1 V to 5 V. As a result, the degree on band bending of the surface potential is much weaker than that when the inversion layer is in presence. The weaker band bending cannot provide hole carriers 65 with sufficient energy to surmount the barrier height of the storage insulator 56. Therefore, the SHHI is shut off in this situation. Notably, similar effect is observed on the potential of the floating gate $V_{FG}$ 82, where $V_{FG}$ 82 is increased as increasing $V_{NW}$. In other words, without the inversion layer in presence, $V_{NW}$ can be capacitively coupled into FG 42. This effect pushes the cell further away from inversion mode, and hence helps shutting off SHHI more effectively.

It is thus clear that the inversion layer 64 plays a critical role on SHHI. Once the inversion layer 64 is formed, it is desirable to maintain such layer through out the erase operation of memory cells of the present invention. A second criterion on SHHI thus can be further provided. This is by maintaining the inversion layer 64 in presence in the channel 50 of the memory cells in accordance with the present invention. Therefore, the criterion can be expressed, to first order, in following formula:

$$[CR_{CF}*V_{CG}+Q_{FG}/C_{total}-(1-CR_{SF}-CR_{DF})V_{SL}]<V_T, \quad \text{Eq. (1)}$$

where $CR_{CF}$, $CR_{SF}$, $CR_{DF}$ is the coupling ratio of CG to FG, source to FG and drain to FG, respectively;

$V_{CG}$ is the control gate voltage;

$Q_{FG}$ is the charges stored on FG, and is a negative value when cell is in a program state;

$C_{total}$ is the total capacitance.

Therefore, based on the formula in Eq. (1), employing the structure of memory cell 400 as an example, it is desirable that $V_{SL}$ (and $V_{BL}$) be set at a voltage of about 0V assuming $V_{NW}$ held at about +4 V to about +6V. For a programmed cell, the typical value for the ratio of $Q_{FG}$ to $C_{total}$ ($Q_{FG}/C_{total}$) can be in the range of about −1.5 V to about −2.0 V. Therefore, setting $V_{CG}$ at about 0V to about −2 V is adequate to meet the second criterion for an effective erase operation. It should be clear to those of ordinary skill in the art having the benefit of this disclosure that the teaching of these criteria and the analyses described herein can be applied to modify the formula to include coupling effect from any additional conductive regions added into the cell structure, and thus are not limited to the described herein but encompass any and all variations falling within the scope of the appended claims. For example, although the criteria are illustrated in memory cell of stack-gate structure, it should be apparent to those having ordinary skill in the art that it can be extended to any other type of cell structures (for example, a cell structure with an additional select gate disposed adjacent to the floating gate). It should be further clear to those of ordinary skill in the art that the voltages and their ranges demonstrated herein are for illustration purposes, and can be modified to different values in accordance with the criteria taught herein for operating cells of the present invention.

One of the unique features provided in the erase operation of the present invention is that there is no high voltage across the storage insulator 56 in memory cells in accordance with the present inventions. This can be better illustrated by referring to FIGS. 9A and 9B. As illustrated in FIG. 9A, the surface potential 81 is "pinned" at a same level for various $V_{NW}$. Therefore, the voltage drop across the storage insulator is determined by the voltage of the inversion layer (hence by $V_{SL}$ when channel of the memory cell is inverted) and by $V_{FG}$ 82. In the example shown here, this voltage drop is in the range of about 1.5 V to about 2 V. This voltage corresponds to a maximum stress field in the insulator at a level of about 2 MV/cm, assuming the insulator is with a thickness of about 100 Å. Notably, the voltage drop across the insulator is much lower in FIG. 9B than in FIG. 9A because a portion of $V_{NW}$ is now coupled into FG 42 when the inversion layer disappeared. This effect is also illustrated by the increase on $V_{FG}$ 82 as increasing $V_{NW}$. Therefore, the maximum field through out the erase operation of the present invention is much lower than the stress field typically seen in the prior art when the Fowler-Nordheim mechanism is employed as the erase method.

Figure 10:
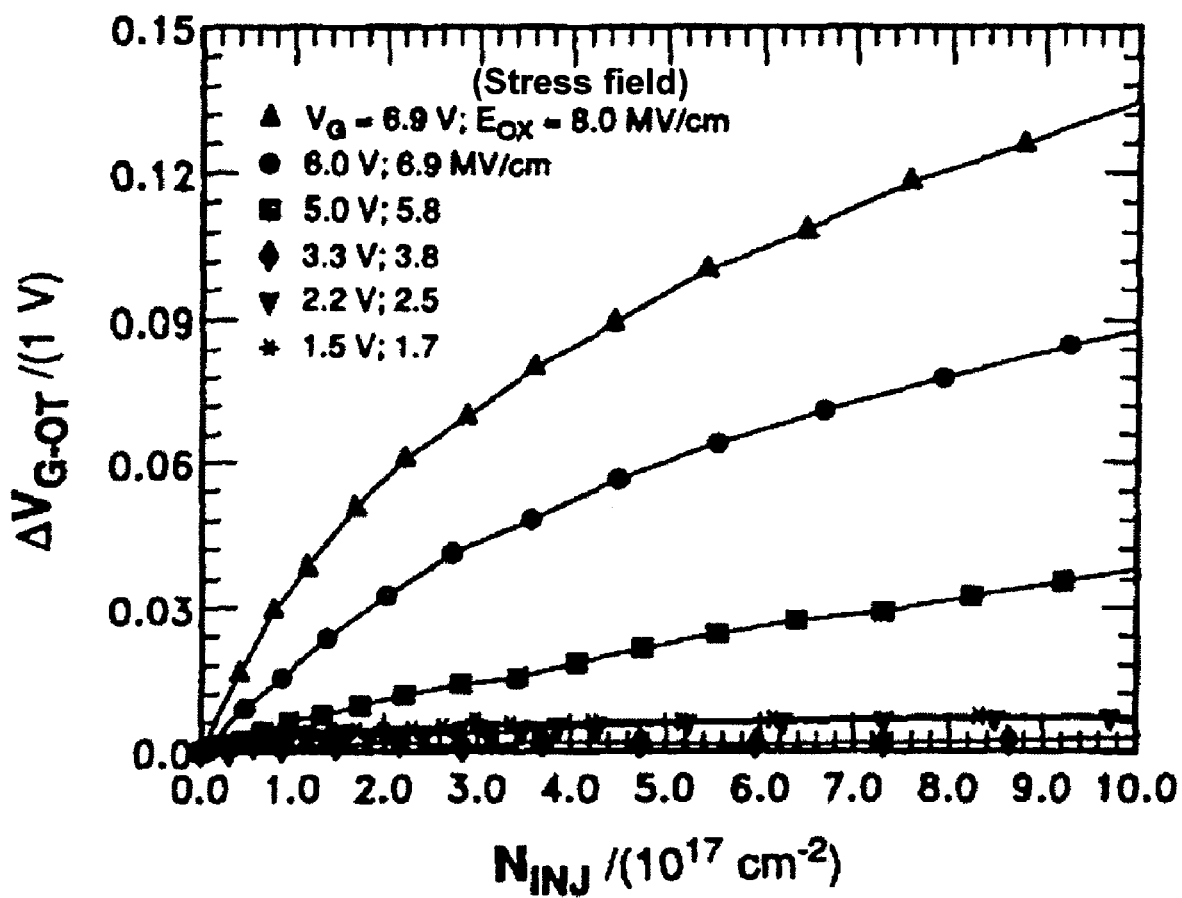
FIG. 10 illustrates the gate voltage shift due to oxide traps for various stress field ($E_{OX}$) applied to the oxide.

The ability on keeping a low stress field on the storage insulator, as provided in the present invention, further provides advantage on suppressing the shift on $V_T(\Delta V_T)$. It is well-known that $V_T$ of the memory cell can be shifted from initial level after the cell received enough program and erase cycles. The shift level of $\Delta V_T$ is known sensitive to the stress field across the insulator (see Nishida et al, "Oxide field and thickness dependence of trap generation in 9–30 nm dry and dry/wet/dry oxides", J. Appl. Phys., vol. 69, pp. 3986–3994, 1991.). FIG. 10 illustrates an example on a chart in the noted article. It can be clearly seen that $\Delta V_{G-OT}$ of the vertical axis, which represents $\Delta V_T$, can be significantly reduced to a level below 0.01 V as the stress field across insulator ($E_{ox}$ shown in legend) is confined to a lower range that is below 3 MV/cm. Furthermore, it is illustrated in FIG. 10 that $\Delta V_{G-OT}$ in this lower range of $E_{ox}$ is insensitive to the amount of injected charge carriers ($N_{INJ}$ in the horizontal axis) flowing through the insulator. The present invention takes advantage of this unique phenomenon in oxide physics and implements it in memory cell operation.

Self-Limiting Erase Method on Memory Cell Operation

Description on the self-limiting mechanism of the erase operation and its usage on cell design and cell operation to prevent over-erase issue will now be provided.

Figure 11A:
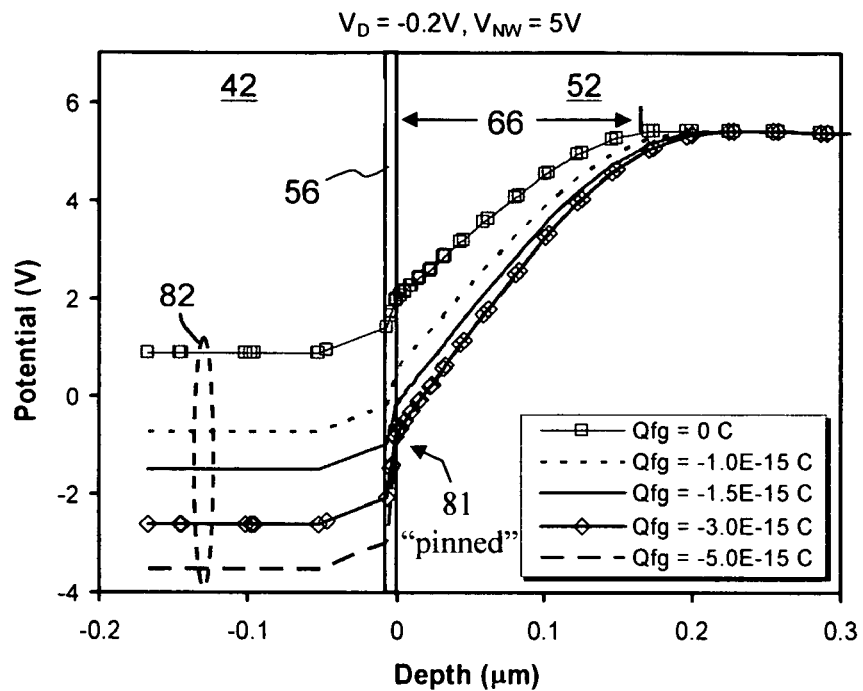
FIG. 11A illustrates the potential along the dotted-line trajectory of hole movement in FIG. 6 for cell at various states of $Q_{FG}$ in the erase operation of cells in accordance with the present invention.

During the erase operation of memory cells in accordance with the present invention, as SHHI continues, the negative charges on the FG are neutralized, and the value $Q_{FG}/C_{total}$ can increase to a range where the inversion layer starts disappearing. FIG. 11A provides the simulation result using cell 400 in FIG. 6 and the bias conditions therein as an illustration. The result in FIG. 11A shows the potential along the trajectory in SCR 66, and is to illustrate the evolution of changes on potential along the evolution of changes on $Q_{FG}$. The evolution of the erase process starts at $Q_{FG}=-5\times10^{-15}$ Coulomb (C) and ends at $Q_{FG}=0$ C. At the early stage of the erase process (i.e. curves corresponding to $Q_{FG}=-5\times10^{-15}$ and $-3\times10^{-15}$ C), the surface potentials 81 of the two cases are shown "pinned" at a same level of about $-1$ V. As SHHI continue, $Q_{FG}$ is increased accordingly and eventually increased beyond a level where the inversion layer disappears. As a result, the surface potential 81 moves away from the "pinned" level to follow the movement of $Q_{FG}$, hence the movement of $V_{FG}$ 82. This movement on surface potential 81 changes the band bending of potential in the SCR 66 dramatically.

Figure 11B:
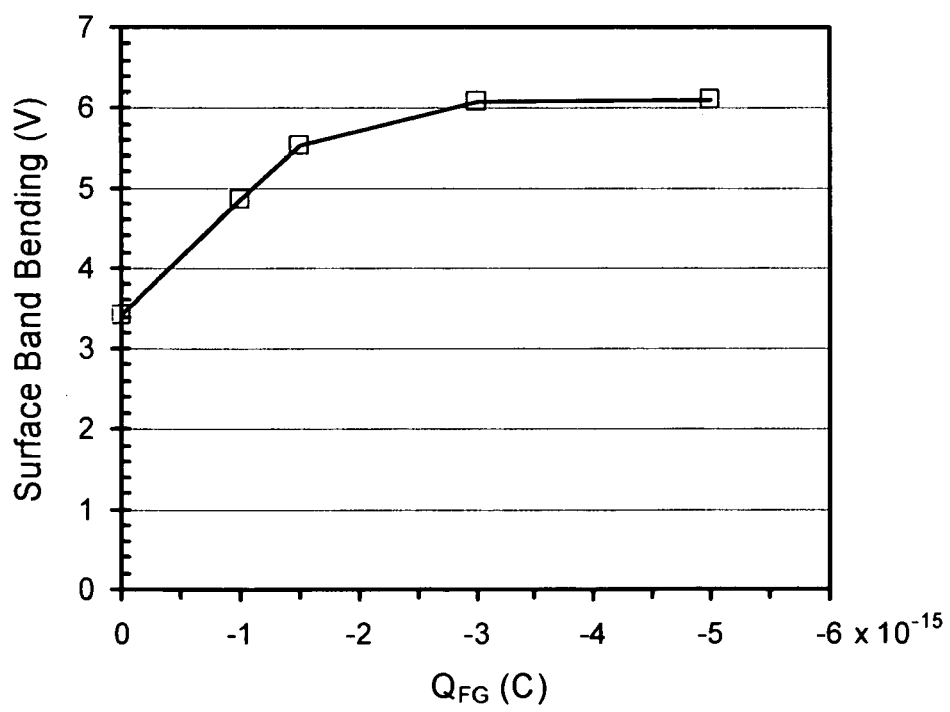
FIG. 11B illustrates the band bending of the surface potential versus various states of $Q_{FG}$ during the erase operation of the memory cells of the present invention.

Illustrated in FIG. 11B is the band bending of the potential in SCR plotted versus various $Q_{FG}$ stored on the floating gate. As SHHI continue, $Q_{FG}$ can increase from $-5\times10^{-15}$ C to 0 C. This results in the band bending to decrease from its initial value (about 6V) to a level below the hole barrier height, thus shutting off the SHHI process itself. This effect provides a self-limiting mechanism to the erase operation of the present invention. This mechanism can prevent the FG from being converted to an unduly positively charged state, thus prevents cells of the present invention from being over-erased from a desired level.

Over-erase issue is well-known in the art. It leads difficulties on programming a p-FET based memory cell when employing ICHE for the operation. For an over-erased p-FET cell, the channel hole current can be so low such that it prohibits the cell from being programmed by using ICHE mechanism (see Chris Diorio, "A p-Channel MOS Synapse Transistor with Self-Convergent Memory Writes," IEEE Trans. Electron Devices, vol. 47, pp. 464–472, 2000). As described in the noted article, the over-erase issue in p-FET based cell can be prevented by employing complicate algorithm to initialize this type of memory cell through trimming cell current to a low level typically in the range of about 100 nA. This algorithm on trimming the cell current is however not required in memory cell of the present invention. This can be better illustrated by referring to the second criterion described hereinbefore (in the Eq. (1)). Employing the erase condition in cell 400 as an illustration, since $V_{SL}=0$ V, the SHHI thus ends as $V_{FG}(=CR_{CF}*V_{CG}+Q_{FG}/C_{total})$ approximately equals $V_T$. Therefore, during the erase operation of the cells of the present invention, the cells start in inversion mode and ends in sub-threshold mode at the end of the erase operation. It is notable that at the end of the self-limiting erase process, the parameters determining the total floating gate charges are to do with the voltages applied to the electrodes of the memory cell as well as the coupling ratio of the capacitor components of corresponding electrodes. Thus with a choice on a set of these parameters, the present invention allows the memory cells be erased to a state a priori. As a result, the cell never got unduly over-erased. In fact, it can be maintained at a level slightly below the sub-threshold level where cell channel current can be at a level ranging from about 10 pA to about 10 nA. Keeping erased cells at such level of state is important as it permits sufficient channel hole current be supplied for ICHE process when a sufficiently negative $V_{CG}$ is applied to the control gate. Different from the memory cell in the noted article, the present invention does not require special algorithm on cell operation to prevent the unduly over-erase issue.

The method on erase operation provided in the present invention has the advantages on high injection efficiency for the erase carriers, self-limiting feature on erase, and immunity from the unduly over-erase. Moreover, there is no high field stress ever appear to the storage insulator, thus the erase method avoids retention failure caused by SILC effect.

The unique portion of a preferred embodiment of the present invention is on employing the ICHE mechanism for the program operation and the SHHI mechanism for the erase operation of the memory cells. The ICHE takes effect as the inversion layer is formed in the channel. Likewise, the SHHI performs its effect while the inversion layer is in presence in the channel, and ends its effect as the inversion layer disappearing from the channel. The inversion layer thus ties the two mechanisms, and hence the two operations together. It provides cell condition at the end of one operation (e.g. erase) be the starting condition for the other operation (e.g. program).

Finally, to read the memory cells of the present invention, a voltage of about +1.8 V can be applied to the source region 46. A voltage of approximately +1.0 V is applied to the drain 48 and approximately 0 V is applied to its CG 40. The n-Well 52 is at a voltage of about +1.8 V. A ground potential is applied to the substrate 54. If the floating gate 42 is negatively charged (i.e. the floating gate 42 is charged of electrons), then the channel 50 is strongly turned on. Thus, a high electrical current will flow from the source 46 to the drain 48. This would be the "1" state. On the other hand, if the floating gate 42 is discharged of electrons, the channel region 50 cannot be strongly turned on, and hence the cell is either weakly turned on or is entirely shut off. Even when CG 40 and the drain 48 are biased at the read potential, little or no current will flow through the channel 50 of the memory cell. In this case, either the current is very small compared to that of the "1" state or there is no current at all. In this manner, the memory cell is sensed to be programmed at the "0" state.

The memory cells in accordance with the present invention can be formed in an array with peripheral circuitry including conventional row address decoding circuitry, column address decoding circuitry, sense amplifier circuitry, output buffer circuitry and input buffer circuitry, which are well known in the art.

Figure 12:
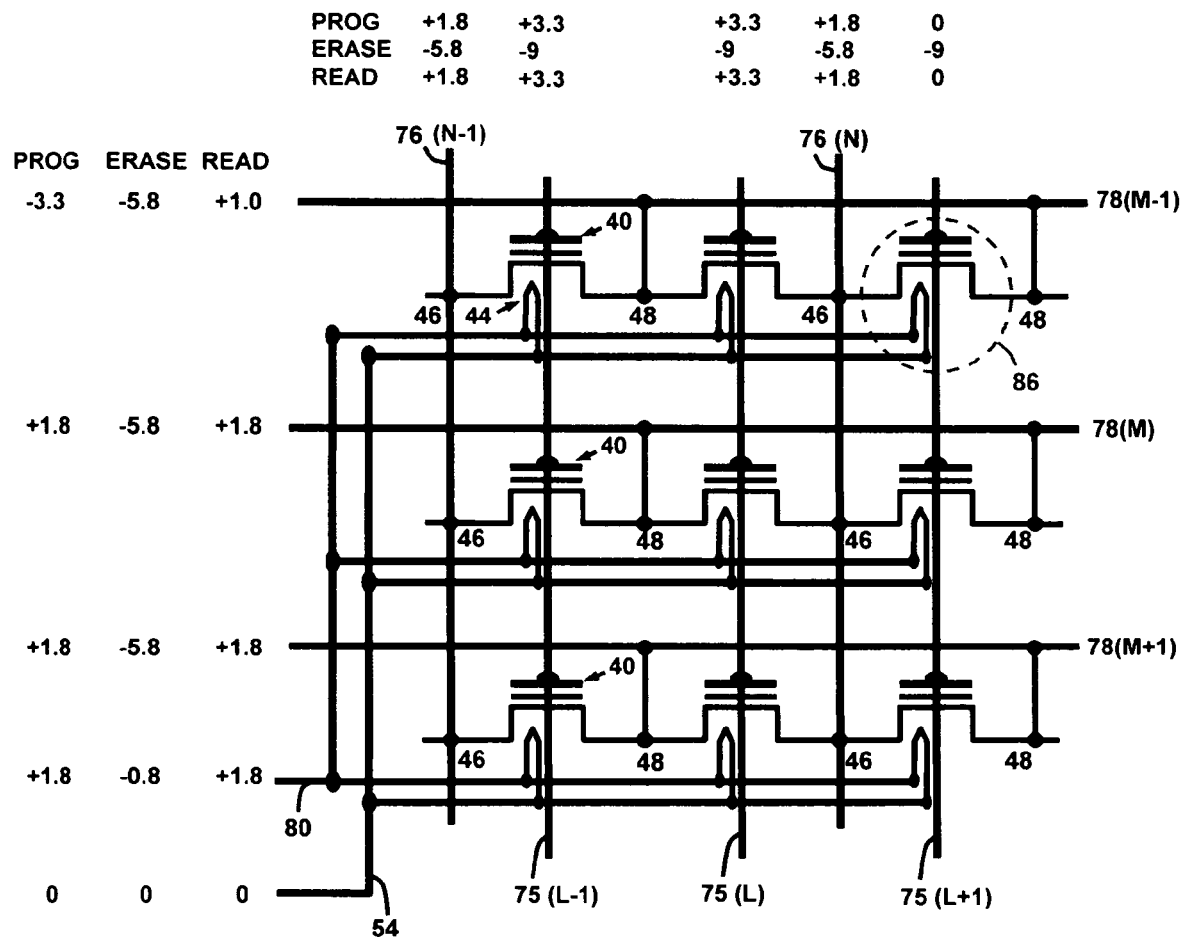
FIG. 12 is a schematic diagram for an array constructed using memory cells in accordance with the present invention.

FIG. 12 illustrates a portion of a memory array constructed in schematic symbol in accordance with the present invention. Also illustrated are bias conditions of cell operations for a selected cell 86 and for un-selected cells (cells other than 86) within the array. Referring to FIG. 12, wherein a NOR array architecture in schematic diagram is shown. The source 46 of each of the memory cells in the same column is connected together through one of the source lines 76. Likewise, the drain 48 of each of the memory cells in the same row is connected together through one of the bit lines 78. The control gate 40 of each of the memory cells in the same column are connected together through one of the word lines (WLs) 75. Thereby, the word line 75(L+1) connects the control gates 40 of each of the memory cells in the rightmost column shown in FIG. 12. Each of the bit lines 78 connects all the drains 48 of memory cells in the same row. Thereby, the bit line 78(M−1) connects the drains 48 of each of the memory cells in the uppermost row shown in FIG. 12. Those of skill in the art will recognize that the term source and drain may be interchanged, and the source and drain lines or source and bit lines may be interchanged. Further, the word line is connected to the control gate of the memory cell. Thus, the term control gate, or control gate line may also be used interchangeably with the term word line.

The NOR array shown in FIG. 12 is a well-known array architecture used as an example to illustrate the array formation using memory cells of the present invention. It should be appreciated that while only a small segment of array region is shown, the example in FIG. 12 illustrates any size of array of such regions. Additionally, the memory cells of the present invention can be applied to other types of NOR array architecture. For example, a memory array wherein cells on each column have their own dedicated source line. Furthermore, although the present invention is illustrated in a single cell and in a NOR array, it should be apparent to those of ordinary skill in the art that a plurality of cells of the present invention can be arranged in a rectangular array of rows and columns, wherein the plurality of cells are constructed in NAND array architecture well-known in the art or a combination of a NAND and a NOR array structure.

The erase operation of the array thus constructed can be done in a small group of such cells (e.g. cells storing a digital word, which contains 8 cells) for byte erase. Additionally, the erase can be done in large group of cells (e.g. cells storing code for software program, which can contains 2048 cells configured in page, or contains a plurality of pages in block in the array architecture).

The present invention is illustrated in non-volatile memory cells storing charges on a charge storage region of a conductive or semiconductor material (i.e. the "floating-gates" 42) that is electrically insulated from but capacitively coupled to surrounding conductive regions. In such storage scheme, charges are evenly distributed through out the charge storage region. However, it should be apparent to those of ordinary skill in the art having the benefit of this disclosure that the present invention is not limited to the illustrated herein and embodiments described above, but can encompass any other type of schemes for storing charges. For example, the memory cells of the present invention can store charges in charge storage region comprising localized storage sites such as silicon nano-crystals or traps in a dielectric layer, as illustrated in FIGS. 13 and 14, respectively.

Figure 13:
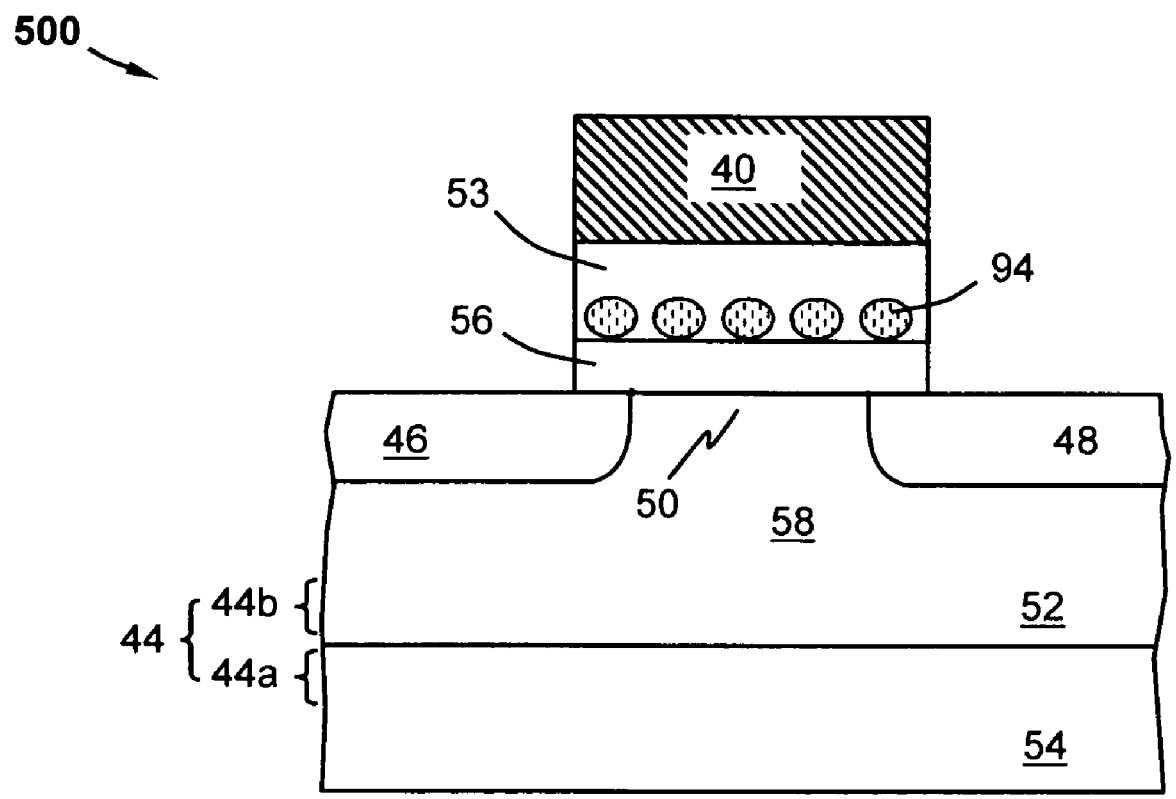
FIG. 13 is a cross-sectional view of a memory cell in accordance with another embodiment of the present invention.

Turning now to FIG. 13, a slight variation of the cell 200 of FIG. 2 is presented in a memory cell 500. The cell 500 is in all respect except one the same as that of FIG. 2. The difference is that instead of a conductive region of FG 42 as the charge storage region, the cell 500 is provided with a plurality of conductive regions (such as silicon) formed in nanometer scale (nano-crystals 94) as the storage region. The nano-crystals 94 can be in an oval shape having a dimension in the range of about 2 nm to about 20 nm, and can be formed in the coupling insulator 53. The coupling insulator 53 is shown in a single layer and can be a layer of a stack of different dielectrics, such as a layer of oxide/nitride/oxide stack.

Figure 14:
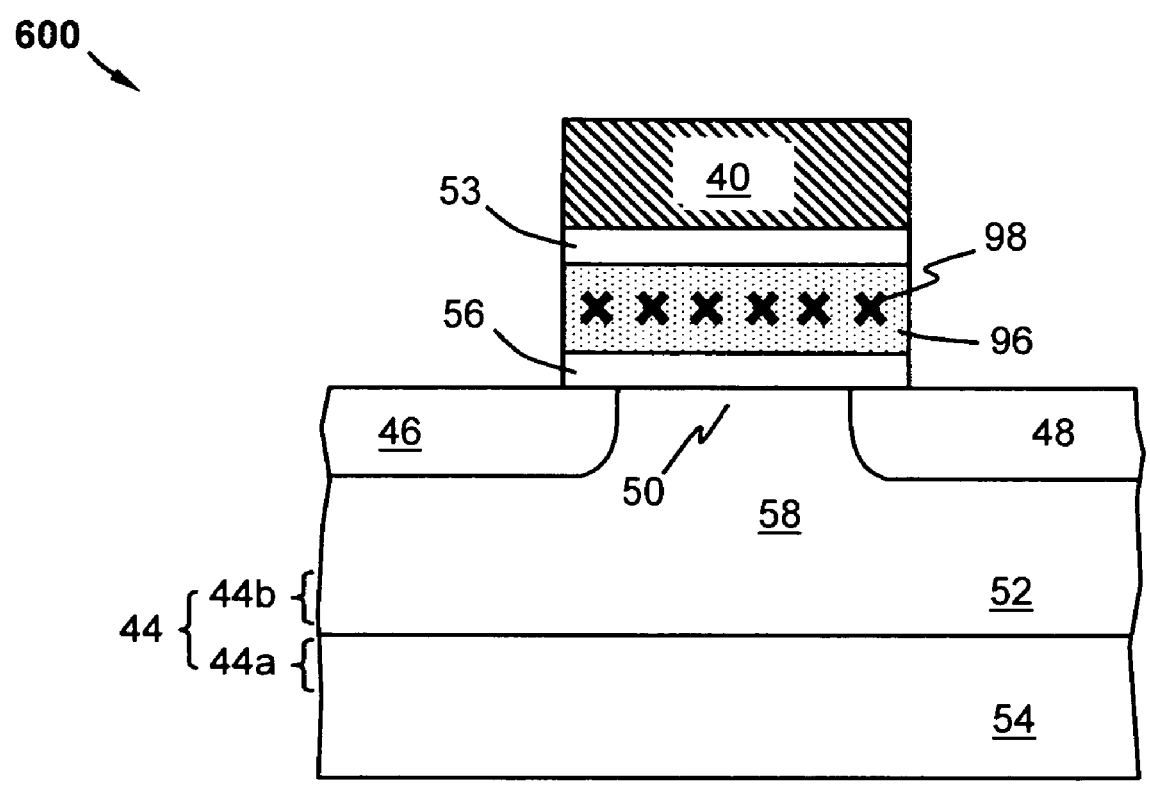
FIG. 14 is a cross-sectional view of a memory cell in accordance with yet another embodiment of the present invention.

FIG. 14 provides cross sectional view on a memory cell 600 of another embodiment in accordance with the present invention. The cell 600 is in all respect except one the same as that of FIG. 2. The difference is that instead of a conductive region for the charge storage region, the cell 500 provides a charge storage region of a trapping dielectric 96 having a plurality of trapping centers (traps 98) in the dielectric 96. The dielectric 96 can be a nitride layer formed, for example, by using LPCVD (Low-Pressure-Chemical-Vapor-Deposition) technique well-known in the art.

Both cells 500 and 600 utilize scheme storing charges in localized storage sites formed of nano-crystals 94 and traps 98, respectively. These cells can be operated in similar way as demonstrated to the cell 200. The advantage of these two cell structure is a negligible interference between adjacent cells when they are arranged in a memory array. Furthermore, in the event there is a local breakdown in surrounding insulators of one of the sites, charges stored at other sites can still be retained.

It is to be understood that the present invention is not limited to the illustrated herein and embodiments described above, but encompasses any and all variations falling within the scope of the appended claims. For example, although the present invention is illustrated in memory cell programmed with ICHE, it should be apparent to those having ordinary skill in the art that it can be extended to any other type of mechanism for programming the memory cell of the present invention (such as Drain-Avalanche Hot-Carrier Injection, or BTBT injection mechanism). Further, although the present cell is illustrated to comprise the storage transistor and the injector, it should be apparent to those of ordinary skill in the art that it can be extended to further comprise a select transistor connected in series with the storage transistor.

Moreover, the floating gate (or the storage region) of the present invention need not be in rectangular shape in their top view, need not be in rectangular in their cross-sections, but rather can be any size and shape in their top view and in their cross-sections that effectively store charges and effectively connects the drain and source regions of each memory cell. Likewise, the source and drain regions need not be in rectangular shape in their top view, need not be in rectangular in their cross-sections, but rather can be any size and shape in their top view and cross-sections. Similarly, the injector region need not be in rectangular shape in their top view, need not be in rectangular in their cross-sections, need not be placed side-by-side with or buried under the channel, need not be isolated from the channel by field oxide, but rather can be any size and shape in their top view and cross-sections, placed in any location, isolated from the channel in any scheme that effectively supply hole carriers for SHHI. Additionally, the top surface portion of the storage region need not be co-planar with the substrate surface, but rather can be at any level under or above the substrate surface that permit the storage region to effectively store charges, effectively coupled with the body, and effectively connects the drain and source regions in each memory cell. Similarly, the bottom surface portion of the storage region need not be parallel to the substrate surface, need not be flat, but rather can be with other shape that permit storage region to effectively store charges, effectively coupled with the body, and effectively connects the drain and source regions of each memory cell. Additionally, the surface of the channel region need not be co-planar with the substrate surface, but rather can be at any level under or above the substrate surface or in any angle with the substrate surface that effectively connects the drain and source regions of each memory cell. Moreover, source and drain regions, and source lines and bit lines, can be swapped. It should be understood that while the figures show the substrate uniformly doped, it is well known that any and/or all of the regions formed therein (source, drain, channel region, body region, etc.) can be formed in one or more well regions (of differently doped silicon).

What is claimed is:

1. An electrically erasable and programmable nonvolatile memory device comprising:

a substrate of semiconductor material of a p-type conductivity;

a well of an n-type conductivity in the substrate;

an injector having a first region of the p-type conductivity and a second region of the n-type conductivity; and a storage transistor having a source and a drain of the p-type conductivity and formed in the well with a channel of the well defined therebetween, a charge storage region disposed over and insulated from the channel by a first insulator, and a control gate disposed over and insulated from the charge storage region by a second insulator.

2. The memory device of claim 1, wherein the first region comprises the substrate.

3. The memory device of claim 1, wherein the second region comprises the well.

4. The memory device of claim 1, wherein the first region comprises a first buried well of the p-type conductivity having a doping level in the range between about $1\times10^{15}$ atoms/cm$^3$ to about $1\times10^{20}$ atoms/cm$^3$.

5. The memory device of claim 1, wherein the second region comprises a second buried well of the n-type conductivity having a doping level in the range between about $1\times10^{16}$ atoms/cm to about $5\times10^{19}$ atoms/cm$^3$.

6. The memory device of claim 1, wherein the first region comprises a semiconductor region of the p-type conductivity disposed adjacent to and isolated from the channel by an isolation region, and the second region comprises the well.

7. The memory device of claim 6, wherein the isolation region comprises an oxide.

8. The memory device of claim 1, wherein the charge storage region comprises polysilicon.

9. The memory device of claim 1, wherein the charge storage region comprises a plurality of spaced-apart nano-crystals of a semiconductor material.

10. The memory device of claim 1, wherein the charge storage region comprises a dielectric having a plurality of charge storing traps.

11. The memory device of claim 1, further comprising:

means for injecting electrons from the channel through the first insulator onto the charge storage region; and means for injecting holes from the injector through the well through the channel through the first insulator onto the charge storage region.

12. An electrically erasable and programmable nonvolatile memory array comprising:

a substrate of semiconductor material of a p-type conductivity;

a well of an n-type conductivity in the substrate; and a plurality of nonvolatile memory cells arranged in a rectangular array of rows and columns, each of the plurality of nonvolatile memory cells comprising:

an injector having a first region of the p-type conductivity and a second region of the n-type conductivity that is electrically connected to the well; and a storage transistor comprising a source and a drain formed in the well and having the p-type conductivity, a channel of the well between the source and the drain, a charge storage region disposed over and insulated from the channel by a first insulator, and a control gate disposed over and insulated from the charge storage region by a second insulator.

13. The memory array of claim 12, wherein for each of the memory cells, the injector is disposed adjacent to and isolated from the channel by an isolation region.

14. The memory array of claim 12, wherein for each of the memory cells, the charge storage region comprises polysilicon.

15. The memory array of claim 12, wherein for each of the memory cells, the charge storage region comprises a dielectric having a plurality of spaced-apart nano-crystals of a semiconductor material.

16. The memory array of claim 12, wherein for each of the memory cells, the charge storage region comprises a dielectric having a plurality of charge storing traps.

17. The memory array of claim 12, wherein the channel of each of the plurality of nonvolatile memory cells is a first channel, and each of the plurality of nonvolatile memory cells further comprising:

a select transistor having a source and a drain of the p-type conductivity formed in the well with a second channel of the well defined therebetween, and a gate disposed over and insulated from the second channel by a third insulator, wherein the source of the select transistor is electrically connected to the drain of the storage transistor.

* * * * *